US012660318B2

(12) United States Patent
Wu

(10) Patent No.: US 12,660,318 B2
(45) Date of Patent: Jun. 16, 2026

(54) ARRAY SUBSTRATE, AND DISPLAY PANEL

(71) Applicant: GUANGZHOU CHINA STAR OPTOELECTRONICS SEMICONDUCTOR DISPLAY TECHNOLOGY CO., LTD., Guangzhou (CN)

(72) Inventor: Wei Wu, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 650 days.

(21) Appl. No.: 18/192,644

(22) Filed: Mar. 30, 2023

(65) Prior Publication Data

US 2024/0266363 A1     Aug. 8, 2024

(30) Foreign Application Priority Data

Feb. 6, 2023     (CN) .......................... 202310095572.1

(51) Int. Cl.
| | |
|---|---|
| *H01L 27/12* | (2006.01) |
| *H10D 86/01* | (2025.01) |
| *H10D 86/40* | (2025.01) |
| *H10D 86/60* | (2025.01) |

(52) U.S. Cl.
CPC ......... *H10D 86/60* (2025.01); *H10D 86/0231* (2025.01); *H10D 86/451* (2025.01)

(58) Field of Classification Search
CPC ... H10D 86/60; H10D 86/0231; H10D 86/451
See application file for complete search history.

(56) References Cited

U.S. PATENT DOCUMENTS

| | | | | |
|---|---|---|---|---|
| 2016/0126494 | A1* | 5/2016 | Jung | H10K 59/121 |
| | | | | 438/23 |
| 2021/0129437 | A1* | 5/2021 | Li | B33Y 50/02 |
| 2021/0225891 | A1* | 7/2021 | Xiao | H10D 86/0231 |
| 2021/0408083 | A1* | 12/2021 | Lin | H10D 99/00 |

* cited by examiner

*Primary Examiner* — William C Trapanese
(74) *Attorney, Agent, or Firm* — PV IP PC; Peter Stecher; Wei Te Chung

(57)     ABSTRACT

Examples of the present disclosure relate to array substrates and methods for manufacturing thereof. The array substrate includes a TFT region and a light-transmitting region including a substrate, a gate insulating layer, a passivation layer and a transparent electrode layer, wherein the transparent electrode layer is in surface contact with at least one of the gate insulating layer and the passivation layer. In the light-transmitting region, at least one of the gate insulating layer and the passivation layer in surface contact with the transparent electrode layer is disposed as a silicon nitride layer. Since the refractive index of the silicon nitride layer is similar to that of the transparent electrode layer, there is a small difference in refractive index between the silicon nitride layer and the transparent electrode layer.

20 Claims, 3 Drawing Sheets

ARRAY SUBSTRATE, AND DISPLAY PANEL

The present disclosure claims priority of Chinese Patent Application No. 202310095572.1, filed on Feb. 6, 2023, the disclosure of which is incorporated herein by reference in its entirety.

TECHNICAL FIELD

The present disclosure relates to a technical field of display, and in particular, to array substrates and display panels.

BACKGROUND

As the resolution of LCD panel becomes higher and higher, the transmittance of a product becomes lower and lower, resulting in higher and higher backlight intensity required for display, the direct effect of which is that the power of a display device becomes higher and higher. Therefore, it is imperative to increase the transmittance of a display panel, and the transmittance of an array substrate directly affects the transmittance of a panel.

In an array substrate, the transmittance of a film=1-reflectivity-absorptivity. Most of the films are light-transmitting inorganic films, and their absorptivity is close to zero, so that the transmittance is mainly affected by reflectivity. The interfacial reflectance between different films is related to the light refractive index of adjacent films, and its mathematical formula is as follows:

$$R_{ab} = \left(\frac{na - nb}{na + nb}\right)^2$$

Rab refers to loss caused by reflection at the interface when light passes through two adjacent films a and b, that is, Rab refers to interface reflectivity of films a and b, and na and nb are the optical refractive indices of the two films a and b, respectively.

In the array substrate of an oxide semiconductor, the gate insulating layer and the passivation layer are usually provided with a silicon oxide layer, wherein the refractive index of the silicon oxide layer ranges from 1.4 to 1.6, and the refractive index of the transparent conductive layer ranges from 1.9 to 2.1. There is a great difference between refractive indices of the silicon oxide layer and the transparent conductive layer, which results high interlayer reflectivity between the silicon oxide layer and the transparent conductive layer, and low light transmittance of the array substrate.

Therefore, the existing array substrate has a technical problem of low transmittance.

SUMMARY

Examples of the present disclosure provide array substrates and display panel, which can alleviate the technical problem of low transmittance of an existing array substrate.

Examples of the present disclosure provide an array substrate comprising a TFT region and a light-transmitting region. The TFT region comprises an active layer, which is an oxide semiconductor film layer. The light-transmitting region comprises:

a substrate;

a gate insulating layer disposed on the substrate;

a passivation layer disposed on one side of the gate insulating layer away from the substrate; and a transparent electrode layer disposed above the substrate; wherein in the light-transmitting region, at least one of the gate insulating layer and the passivation layer is in surface contact with the common electrode layer, and the at least one of the gate insulating layer and the passivation layer in surface contact with the transparent electrode layer are a single-layer structure of a silicon nitride layer.

Optionally, in some examples of the present disclosure, the transparent electrode layer is a common electrode layer disposed on one side of the gate insulating layer close to the substrate, and the gate insulating layer is a single-layer structure of the silicon nitride layer in the light-transmitting region.

Optionally, in some examples of the present disclosure, in the light-transmitting region, a refractive index transition layer is further disposed at one side of the common electrode layer close to the substrate, and a refractive index of the refractive index transition layer is between a refractive index of the common electrode layer and a refractive index of the substrate.

Optionally, in some examples of the present disclosure, one side of the transparent electrode layer is disposed in surface contact with the gate insulating layer, another side of the transparent electrode layer is disposed in surface contact with the passivation layer, and the passivation layer is a single-layer structure of the silicon nitride layer in the light-transmitting region.

Optionally, in some examples of the present disclosure, the gate insulating layer comprises a silicon oxide layer close to the substrate and the silicon nitride layer away from the substrate, wherein the silicon nitride layer of the gate insulating layer is disposed in surface contact with the common electrode layer, and the silicon oxide layer of the gate insulating layer is disposed in surface contact with the substrate.

Optionally, in some examples of the present disclosure, the passivation layer comprises a first passivation layer close to the substrate and a second passivation layer away from the substrate, and the transparent electrode layer is disposed between the first passivation layer and the second passivation layer, wherein the first passivation layer is a single-layer structure of the silicon nitride layer in the light-transmitting region.

Optionally, in some examples of the present disclosure, one side of the gate insulating layer close to the substrate is in surface contact with the substrate, and the gate insulating layer comprises a silicon oxide layer disposed on the substrate and the silicon nitride layer disposed on one side of the silicon oxide layer away from the substrate.

Optionally, in some examples of the present disclosure, one side of the gate insulating layer close to the substrate is in surface contact with the substrate, and the gate insulating layer is a single-layer structure of a silicon oxide layer in the light-transmitting region.

Optionally, in some examples of the present disclosure, an absolute value of a difference between a refractive index of the silicon nitride layer and a refractive index of the transparent electrode layer is less than or equal to 0.1.

Examples of the present disclosure further provide a display panel including the array substrate described in any one of the above examples.

Technical effects: since the refractive index of the silicon nitride layer is similar to that of the transparent electrode layer, the refractive index ranges from 1.9 to 2.1, and in the light-transmitting region, at least one of the gate insulating layer and the passivation layer in surface contact with the transparent electrode layer is disposed as a silicon nitride layer, the interface reflectivity between the silicon nitride layer and the transparent electrode layer can be reduced, transmittance of the array substrate can be improved, and the technical problem of low transmittance of the existing array substrate can be alleviated.

BRIEF DESCRIPTION OF THE DRAWINGS

In order to more clearly describe the technical solutions in examples of the present disclosure, hereinafter, the appended drawings used for describing the examples in the present disclosure will be briefly introduced. Apparently, the appended drawings described below are only directed to some examples of the present disclosure, and for a person skilled in the art, without expenditure of creative labor, other drawings can be derived on the basis of these appended drawings.

LIST OF REFERENCE SIGNS

Figures 1, 2:
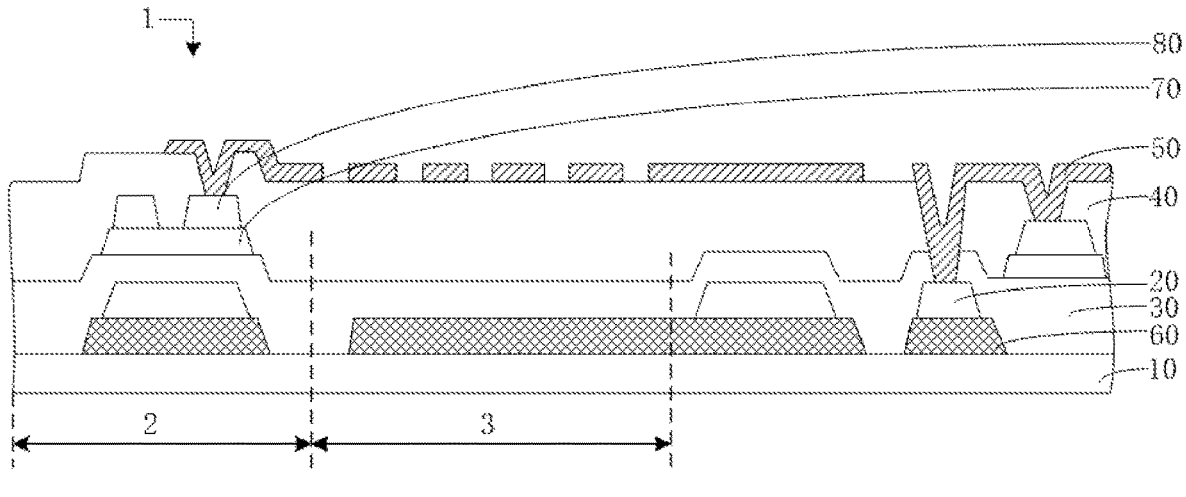
FIG. 1 is a first schematic cross-sectional view of an array substrate according to an example of the present disclosure.
FIG. 2 is a second schematic cross-sectional view of an array substrate according to an example of the present disclosure.

| Reference signs | Name of components | Reference signs | Name of components |
| --- | --- | --- | --- |
| 1 | Array substrate | 10 | Substrate |
| 20 | Gate layer | 30 | Gate insulating layer |
| 40 | Passivation layer | 401 | First passivation layer |
| 402 | Second passivation layer | 50 | Pixel electrode layer |
| 60 | Common electrode layer | 70 | Active layer |
| 80 | Source/drain layer | 90 | Refractive index transition layer |
| 100 | PFA film | 2 | TFT region |
| 3 | Light-transmitting region | | |

DETAILED DESCRIPTION

Hereinafter, technical solutions in examples of the present disclosure will be clearly and completely described with reference to the accompanying drawings in examples of the present disclosure. Apparently, the described examples are part of, but not all of, the examples of the present disclosure. All the other examples, obtained by a person with ordinary skill in the art on the basis of the examples in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as "up" and "down" generally refers to "up" and "down" in the actual use or working state of a device, and specifically refers to the drawing direction in the drawings; while "inside" and "outside" refer to outline of a device.

With respect to FIG. 1, the present disclosure provides an array substrate 1, which includes a substrate 10, a gate insulating layer 30, a passivation layer 40, and a transparent electrode layer. The transparent electrode layer may be a common electrode layer 60 or a pixel electrode layer 50. The gate insulating layer 30 is disposed on the substrate 10, the passivation layer 40 is disposed on one side of the gate insulating layer 30 away from the substrate 10, the common electrode 60 is disposed above the substrate 10. At least one of the gate insulating layer 30 and the passivation layer 40 in surface contact with the transparent electrode layer is disposed as a silicon nitride layer.

The transparent electrode layer has a refractive index ranging from 1.9 to 2.1 and the silicon nitride layer has a refractive index ranging from 1.9 to 2.1.

In this example, in the light-transmitting region 3, at least one of the gate insulating layer 30 and the passivation layer 40 in surface contact with the transparent electrode layer is disposed as a silicon nitride layer. Since the refractive index of the silicon nitride layer is similar to that of the transparent electrode layer, and the refractive index ranges from 1.9 to 2.1, the interface reflectivity between the silicon nitride layer and the transparent electrode layer can be reduced, transmittance of the array substrate can be improved, and the technical problem of low transmittance of the existing array substrate can be alleviated.

Technical solutions of the present disclosure will now be described in connection with specific examples.

In the following examples, the transparent electrode layer is taken as the common electrode layer 60 for example for illustration.

It should be noted that improvement of the gate insulating layer 30 and the passivation layer 40 in the present disclosure is carried out in the light-transmitting region 3. In the TFT region 2, the gate insulating layer 30 may still be kept as a stacked structure of a silicon oxide layer and a silicon nitride layer, and the passivation layer 40 may still be kept as a stacked structure of a silicon oxide layer and a silicon nitride layer.

It should be noted that for the array substrate 1 of a LCD panel, the common electrode layer 60 is disposed in at least three ways:

(1) With respect to FIGS. 1 and 2, the common electrode layer 60 may be disposed on one side of the gate insulating layer 30 close to the substrate 10, and the common electrode layer 60 is disposed in surface contact with the gate insulating layer 30.

Figure 3:
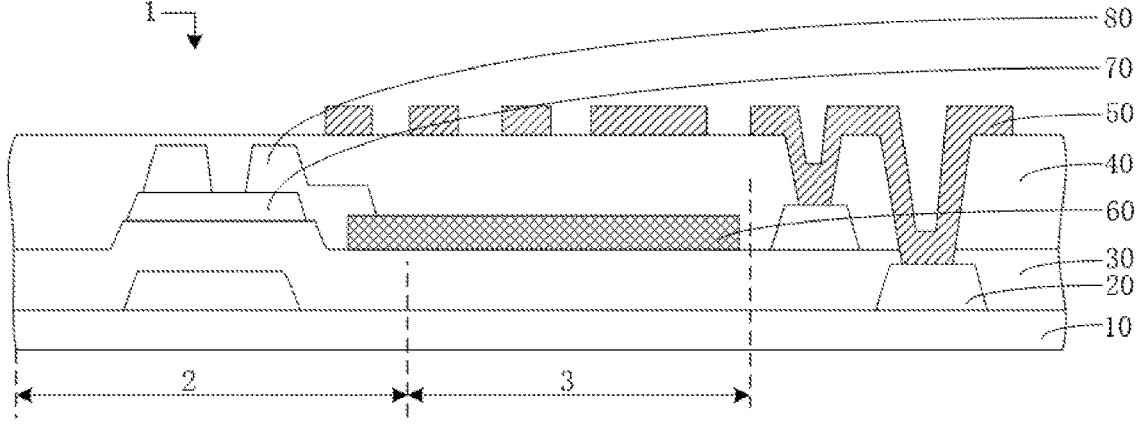
FIG. 3 is a third schematic cross-sectional view of an array substrate according to an example of the present disclosure.

(2) With respect to FIG. 3, the common electrode layer 60 may be disposed between the passivation layer 40 and the gate insulating layer 30, and the two surfaces of the common electrode layer 60 parallel to the substrate may be disposed in surface contact with the gate insulating layer 30 and the passivation layer 40, respectively.

Figure 4:
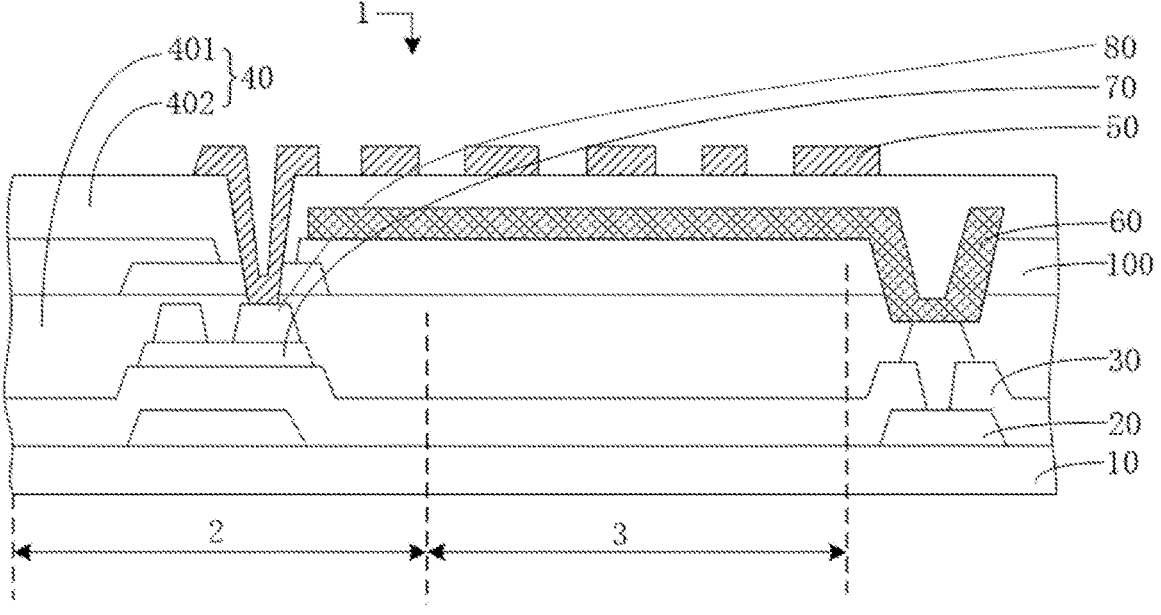
FIG. 4 is a fourth schematic cross-sectional view of an array substrate according to an example of the present disclosure.

(3) With respect to FIG. 4, the common electrode layer 60 may be disposed on one side of the passivation layer 40 away from the substrate 10, and the common electrode layer 60 is disposed in surface contact with the passivation layer 40.

Further, liquid crystal display mode of the array substrate 1 may be fringe field switching (FFS), and a material for preparing an active layer 70 of the array substrate 1 is an oxide semiconductor material. In the present disclosure, only the array substrate 1 of the display panel of the IGZO semiconductor oxide TFT in which the liquid crystal alignment mode is FFS is taken as an example, and other alignment modes, array substrate 1 of other TFT types, and display panels are also applicable to the inventive concept of the present disclosure.

In an example, in the light-transmitting region 3, both the gate insulating layer 30 and the passivation layer 40 may be a single-layer structure of the silicon nitride layer. In the TFT region 2, the gate insulating layer 30 and the passivation layer 40 may be a single-layer structure of the silicon nitride layer or a stacked structure of the silicon nitride layer and the silicon oxide layer, so as to ensure protection of the active layer 70 and the TFT device. The definition of protection includes, but is not limited to, blocking water and oxygen entering, preventing etching or fabrication process from affecting yield of TFT device, or the like.

Further, the refractive index of the pixel electrode layer 50 may also be 1.9 to 2.1.

Further, the refractive index of the pixel electrode layer 50 may be the same as that of the common electrode layer 60.

Further, material for preparing the pixel electrode layer 50 and the common electrode layer 60 may be the same.

In an example, with respect to FIG. 1, the common electrode layer 60 is disposed on one side of the gate insulating layer 30 close to the substrate 10, the passivation layer 40 is a single-layer structure of the silicon nitride layer, and the gate insulating layer 30 is a single-layer structure of the silicon nitride layer.

The passivation layer 40 is in surface contact with the pixel electrode layer 50, and the refractive index of the pixel electrode layer 50 ranges from 1.9 to 2.1.

It can be understood that for the passivation layer 40 and the pixel electrode layer 50, which are in surface contact with each other, since the refractive index of the passivation layer 40 ranges from 1.9 to 2.1, the refractive index of the pixel electrode layer 50 also ranges from 1.9 to 2.1, there is a small difference in refractive index between the passivation layer 40 and the pixel electrode layer 50, and the absolute value of the difference in refractive index between the passivation layer 40 and the pixel electrode layer 50 is less than 0.2, thus the interfacial reflectivity between the pixel electrode layer 50 and the passivation layer 40 is reduced.

Further, the refractive index of the passivation layer 40 may be equal to that of the pixel electrode layer 50.

The gate insulating layer 30 is in surface contact with the common electrode layer 60.

It can be understood that for the gate insulating layer 30 and the common electrode layer 60 which are in surface contact with each other, when the gate insulating layer 30 is a silicon nitride layer, there is a small difference in refractive index between the common electrode layer 60 and the gate insulating layer 30, thus reducing the interfacial reflectivity between the common electrode layer 60 and the gate insulating layer 30.

In this example, in the light-transmitting region 3, the passivation layer 40 in surface contact with the pixel electrode layer 50 is disposed as a single-layer structure of the silicon nitride layer, and the gate insulating layer 30 in surface contact with the common electrode layer 60 is disposed as a single-layer structure of the silicon nitride layer, so that the interface reflectivity between the passivation layer 40 and the pixel electrode layer 50 is reduced, and the interface reflectivity between the gate insulating layer 30 and the common electrode layer 60 is also reduced, thereby greatly improving the transmittance of the array substrate 1 in the transmission region.

In an example, with respect to FIG. 2, one side of the common electrode layer 60 close to the substrate 10 is also provided with a refractive index transition layer 90, which has a refractive index between that of the common electrode layer 60 and that of the substrate 10.

The refractive index transition layer 90 may be a silicon oxynitride layer, and it may have a refractive index ranging from 1.5 to 2.0.

Specifically, when the refractive index transition layer 90 is a silicon oxynitride layer, its refractive index of can be changed between 1.5 and 2.0 by adjusting the ratio of nitrogen to oxygen in the refractive index transition layer 90.

It can be understood that when the refractive index of the refractive index transition layer 90 may be 1.5 to 1.6, there is a small difference in refractive index between the refractive index transition layer 90 and the refractive index of the substrate 10, thus reducing the interfacial reflectivity between the refractive index transition layer 90 and the substrate 10. When the refractive index of the refractive index transition layer 90 ranges from 1.9 to 2.0, the interface reflectivity between the refractive index transition layer 90 and the common electrode layer 60 is reduced.

In this example, the refractive index of the refractive index transition layer 90 is larger than that of the substrate 10, and the refractive index of the refractive index transition layer 90 is smaller than that of the common electrode layer 60, thereby serving as a refractive index transition between the common electrode layer 60 and the substrate 10, avoiding a large change in the refractive index in the direction perpendicular to the substrate 10, reducing the interfacial reflectivity between the substrate 10 and the common electrode layer 60, and improving the transmittance of the film layer between the substrate 10 and the common electrode layer 60.

In an example, with respect to FIG. 3, one side of the common electrode layer 60 is disposed in surface contact with the gate insulating layer 30, and the other side of the common electrode layer 60 is disposed in surface contact with the passivation layer 40.

At least one of the passivation layer 40 and the gate insulating layer 30 is a single-layer structure of the silicon nitride layer.

The refractive index of the silicon nitride layer and the common electrode layer 60 ranges from 1.9 to 2.1.

The material for preparing the common electrode layer 60 may be at least one of indium tin oxide, indium gallium zinc oxide, and indium zinc oxide.

It can be understood that by disposing the gate insulating layer 30 as a single-layer structure of the silicon nitride layer, the refractive index of the gate insulating layer 30 ranges from 1.9 to 2.1, so that difference in refractive index between the gate insulating layer 30 and the common electrode layer 60 is reduced, thereby reducing the interface reflectivity between the gate insulating layer 30 and the common electrode layer 60.

It can be understood that by disposing the passivation layer 40 a as a single-layer structure of the silicon nitride layer, the refractive index of the silicon nitride layer ranges from 1.9 to 2.1, so that difference in refractive index between the passivation layer 40 and the common electrode layer 60 is reduced, thereby reducing the interface reflectivity between the passivation layer 40 and the common electrode layer 60.

In this example, by disposing at least one of the gate insulating layer 30 and the passivation layer 40 as a silicon nitride layer, the interface reflectivity between the common electrode layer 60 and at least one of the passivation layer 40 and the gate insulating layer 30 is reduced.

In an example, the gate insulating layer 30 includes a silicon oxide layer close to the substrate 10, and the silicon nitride layer away from the substrate 10, wherein the silicon nitride layer of the gate insulating layer 30 is disposed in surface contact with the common electrode layer 60, and the silicon oxide layer of the gate insulating layer 30 is disposed in surface contact with the substrate 10.

The refractive index of the silicon oxide layer ranges from 1.4 to 1.6, and the refractive index of the substrate 10 is about 1.5, so there is a small difference in refractive index between the silicon oxide layer and the substrate 10.

The refractive index of the silicon nitride layer ranges from 1.9 to 2.1, and the refractive index of the common electrode layer 60 also ranges from 1.9 to 2.1, so there is a small difference in refractive index between the silicon nitride layer and the common electrode layer 60.

In this example, the silicon oxide layer of the gate insulating layer 30 is in surface contact with the substrate 10, so that the interface reflectivity between the gate insulating layer 30 and the substrate 10 can be reduced, thereby further improving transmittance of the array substrate 1.

In an example, with respect to FIG. 4, the passivation layer 40 includes a first passivation layer 401 clsoe to the substrate 10, a second passivation layer 402 away from the substrate 10, the common electrode layer 60 is disposed on the side of the first passivation layer 401 away from the substrate 10, and the common electrode layer 60 is disposed on the side of the second passivation layer 402 close to the substrate 10. The first passivation layer 401 is a single-layer structure of the silicon nitride layer in the light-transmitting region 3. The second passivation layer 402 is a single-layer structure of the silicon nitride layer.

A PFA film layer 100 is further disposed on one side of the first passivation layer 401 away from the substrate 10.

One side surface of the second passivation layer 402 away from the substrate 10 is in surface contact with the pixel electrode layer 50.

One side of the second passivation layer 402 close to the substrate 10 is in surface contact with the common electrode layer 60.

One side of the first passivation layer 401 away from the substrate 10 is in surface contact with the PFA film layer 100.

In this example, the interface reflectivity between the second passivation layer 402 and the pixel electrode layer 50 can be reduced at the same time, and the interface reflectivity between the second passivation layer 402 and the common electrode layer 60 can also be reduced by disposing the second passivation layer 402 as a silicon nitride layer. The interface reflectivity between the first passivation layer 401 and the common electrode layer 60 can be reduced by disposing the first passivation layer 401 as a silicon nitride layer.

In an example, the gate insulating layer 30 is in surface contact with the substrate 10 and includes a silicon oxide layer disposed on the substrate 10, and a silicon nitride layer disposed on one side of the silicon oxide layer away from the substrate 10.

The refractive index of the substrate 10 is about 1.5, and the refractive index of the silicon oxide layer ranges from 1.4 to 1.6, so there is a small difference in refractive index between the substrate 10 and the silicon oxide layer.

In this example, the gate insulating layer 30 is disposed as a stacked structure of a silicon oxide layer and a silicon nitride layer, and the silicon oxide layer of the gate insulating layer 30 is brought into surface contact with the substrate 10, thereby reducing the interface reflectivity between the substrate 10 and the gate insulating layer 30.

In an example, the gate insulating layer 30 is a single-layer structure of a silicon oxide layer in the light-transmitting region 3.

In an example, the absolute value of difference in refractive index between the silicon nitride layer and the transparent electrode layer is less than or equal to 0.1.

Further, the refractive index of the silicon nitride layer is equal to that of the common electrode layer 60.

In this example, since the interfacial reflectivity between adjacent layers has a large correlation with difference in refractive index of the layers, the interfacial reflectivity between the silicon nitride layer and the common electrode layer 60 can be further reduced by defining that the absolute value of difference in refractive index between the silicon nitride layer and the common electrode layer 60 is less than or equal to 0.1.

Figure 5:
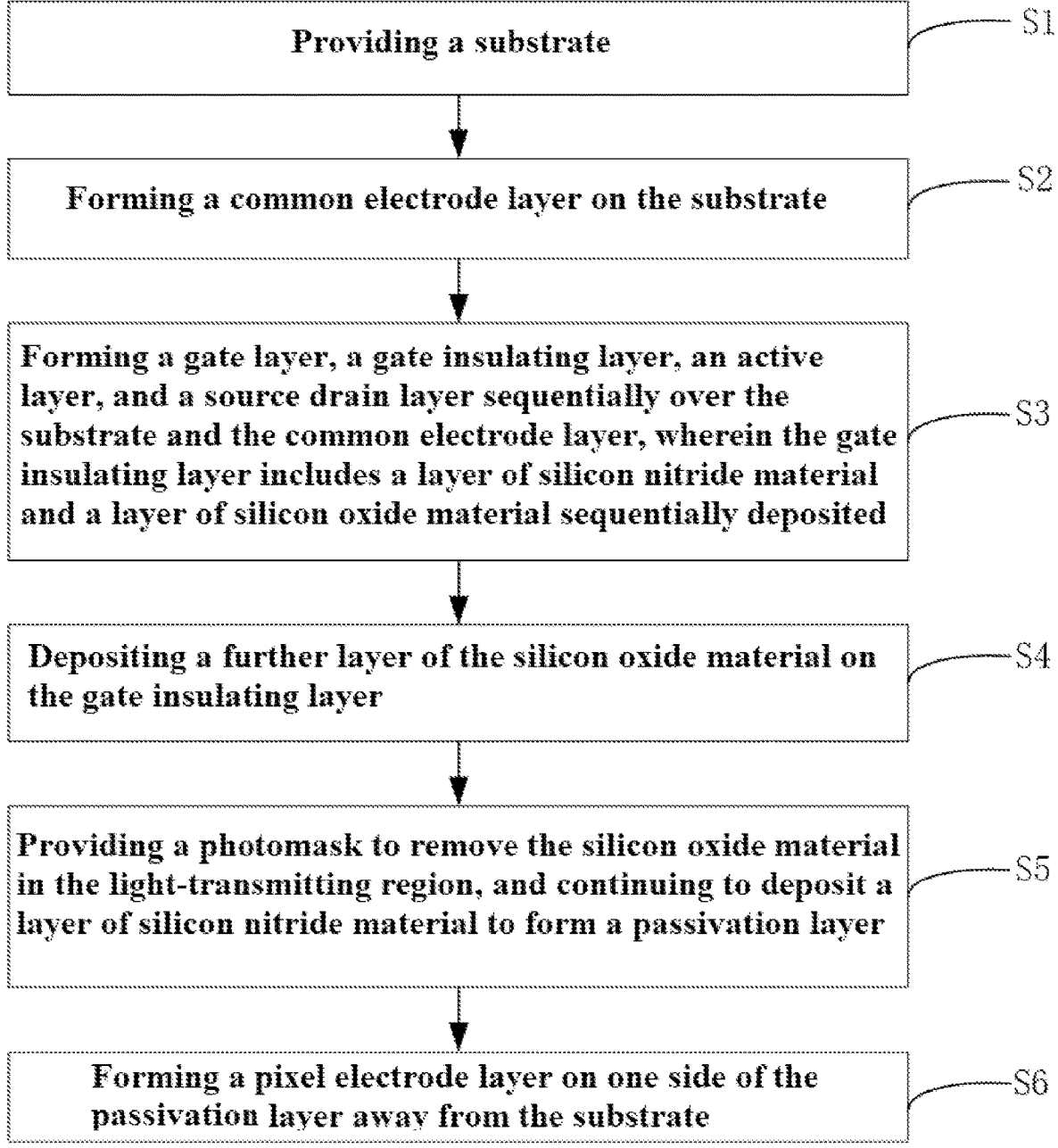
FIG. 5 is a schematic flowchart of a method for manufacturing an array substrate according to an example of the present disclosure.

With respect to FIG. 5, an example of the present disclosure provides a method for manufacturing an array substrate 1, which includes:

S1: providing a substrate 10.

S2: forming a common electrode layer 60 on the substrate 10.

S3: forming a gate layer 20, a gate insulating layer 30, an active layer 70, and a source drain layer 80 sequentially over the substrate 10 and the common electrode layer 60, wherein the gate insulating layer 30 includes a layer of silicon nitride material and a layer of silicon oxide material sequentially deposited.

S4: depositing a further layer of the silicon oxide material on the gate insulating layer 30.

S5: providing a photomask to remove the silicon oxide material in the light-transmitting region 3, and continuing to deposit a layer of silicon nitride material to form a passivation layer 40.

S6: forming a pixel electrode layer 50 on one side of the passivation layer 40 away from the substrate 10.

In the step of removing the silicon oxide material in the light-transmitting region 3 by using the photomask, the silicon oxide material of the gate insulating layer 30 and the silicon oxide material of the passivation layer 40 in the light-transmitting region 3 can be removed in a one-step process by using a photomask.

In an example, when the common electrode layer 60 is disposed between the gate insulating layer 30 and the passivation layer 40, and both sides of the common electrode layer 60 are in surface contact with the gate insulating layer 30 and the passivation layer 40 in the direction of perpendicular to the substrate 10, the silicon oxide material of the gate insulating layer 30 and the silicon oxide material of the passivation layer 40 can be removed in two steps. Specifically, depositing a layer of silicon nitride material and a layer of silicon oxide material above the substrate 10, removing the silicon oxide material in the light-transmitting region 3 through a photomask to obtain the gate insulating layer 30, and forming a common electrode layer 60 on the gate insulating layer 30. Then depositing another layer of silicon oxide material above the common electrode layer 60 and on the gate insulating layer 30, followed by removing the silicon oxide material in the light-transmitting region 3 through a photomask, and continuing depositing a layer of silicon nitride material to obtain the passivation layer 40.

Further, the passivation layer 40 may be formed by directly depositing and forming a layer of silicon nitride material directly above the common electrode layer 60 and on the gate insulating layer 30 to form the passivation layer 40. In this example, it is not necessary to form another layer of silicon oxide material, and therefore, it is not necessary to remove the silicon oxide material with a photomask.

In the above-described examples, a silicon oxide material can be formed in the TFT region 2 by means of firstly forming a silicon oxide material and then removing the silicon oxide material in the light-transmitting region 3 with a photomask, thereby enhancing the barrier effect to water and oxygen of the inorganic film layer in the TFT region 2. While in the means of forming a silicon nitride material in at least one of the gate insulating layer 30 and the passivation layer 40, one photomask process can be saved, so that costs can be reduced. Both means have their own advantages and disadvantages, and the corresponding choice should be made according to actual requirements.

The present disclosure further provides a display panel, which may be specifically a liquid crystal display panel. The liquid crystal display panel may include an opposing substrate, a liquid crystal layer, and the above array substrate, wherein the opposing substrate and the array substrate are disposed opposite to each other, and the liquid crystal layer is disposed between the opposing substrate and the array substrate.

A color film layer may be disposed on the opposing substrate, or the color film layer may be disposed on the array substrate. Alternatively, the display panel may be another display panel such as an electronic paper.

The array substrate provided in this example comprises a substrate, a gate insulating layer, a passivation layer, and a transparent electrode layer, wherein the gate insulating layer is disposed on the substrate, the passivation layer is disposed on one side of the gate insulating layer away from the substrate, and the transparent electrode layer is disposed above the substrate. At least one of the gate insulating layer and the passivation layer in surface contact with the transparent electrode layer is a silicon nitride layer. The refractive index of the transparent electrode layer ranges from 1.9 to 2.1, and the refractive index of the silicon nitride layer ranges from 1.9 to 2.1. By disposing at least one of the gate insulating layer 30 and the passivation layer 40 in surface contact with the transparent electrode layer as a silicon nitride layer, the interface reflectivity between the silicon nitride layer and the transparent electrode layer can be reduced, transmittance of the array substrate can be improved, and the technical problem of low transmittance of the existing array substrate can be alleviated, because the refractive index of the silicon nitride layer is similar to that of the transparent electrode layer, and the refractive index ranges from 1.9 to 2.1.

In the above-mentioned examples, the description of each example has its own focus. For parts that are not described in detail in an example, please refer to related descriptions of other examples.

The array substrate, the method for manufacturing the array substrate, and the display panel provided in the examples of the present disclosure are described in detail. The principles and embodiments of the present disclosure are described by using specific examples herein. Descriptions of the above examples are merely intended to help understand the technical solutions and core ideas of the present disclosure. Meanwhile, for a person skilled in the art, it is still possible to change the specific embodiments and the scope of application according to the idea of the present disclosure. In view of the above, the contents of the specification should not be construed as limiting the present disclosure.

What is claimed is:

1. An array substrate comprising a TFT region and a light-transmitting region,
wherein the light-transmitting region comprises:
a substrate;
a gate insulating layer disposed on the substrate;
a passivation layer disposed on one side of the gate insulating layer away from the substrate; and
a transparent electrode layer disposed above the substrate;
wherein in the light-transmitting region, at least one of the gate insulating layer and the passivation layer is in surface contact with the transparent electrode layer, and the at least one of the gate insulating layer and the passivation layer in surface contact with the transparent electrode layer are a single-layer structure of a silicon nitride layer; and
wherein the transparent electrode layer is a common electrode layer, in the light-transmitting region, a refractive index transition layer is further disposed at one side of the common electrode layer close to the substrate, and a refractive index of the refractive index transition layer is between a refractive index of the common electrode layer and a refractive index of the substrate.

2. The array substrate according to claim 1, wherein the common electrode layer is disposed on one side of the gate insulating layer close to the substrate, and the gate insulating layer is a single-layer structure of the silicon nitride layer in the light-transmitting region.

3. The array substrate according to claim 1, wherein one side of the transparent electrode layer is disposed in surface contact with the gate insulating layer, another side of the transparent electrode layer is disposed in surface contact with the passivation layer, and the passivation layer is a single-layer structure of the silicon nitride layer in the light-transmitting region.

4. The array substrate according to claim 3, wherein the gate insulating layer comprises a silicon oxide layer close to the substrate and the silicon nitride layer away from the substrate, wherein the silicon nitride layer of the gate insulating layer is disposed in surface contact with the common electrode layer, and the silicon oxide layer of the gate insulating layer is disposed in surface contact with the substrate.

5. The array substrate according to claim 1, wherein the passivation layer comprises a first passivation layer close to the substrate and a second passivation layer away from the substrate, and the transparent electrode layer is disposed between the first passivation layer and the second passivation layer, wherein the first passivation layer is a single-layer structure of the silicon nitride layer in the light-transmitting region.

6. The array substrate according to claim 5, wherein one side of the gate insulating layer close to the substrate is in surface contact with the substrate, and the gate insulating layer comprises a silicon oxide layer disposed on the substrate and a silicon nitride layer disposed on one side of the silicon oxide layer away from the substrate.

7. The array substrate according to claim 5, wherein one side of the gate insulating layer close to the substrate is in surface contact with the substrate, and the gate insulating layer is a single-layer structure of a silicon oxide layer in the light-transmitting region.

8. The array substrate according to claim 1, wherein an absolute value of a difference between a refractive index of the silicon nitride layer and a refractive index of the transparent electrode layer is less than or equal to 0.1.

9. A method for manufacturing the array substrate according to claim 1, comprising:

a: providing a substrate;

b, forming a common electrode layer on the substrate;

c, forming a gate layer, a gate insulating layer, an active layer, and a source drain layer sequentially over the substrate and the common electrode layer, wherein the gate insulating layer comprises a layer of silicon nitride material and a layer of silicon oxide material sequentially deposited;

d: depositing a further layer of the silicon oxide material on the gate insulating layer;

e: providing a photomask to remove the silicon oxide material in a light-transmitting region, and continuing to deposit a layer of silicon nitride material to form a passivation layer; and f: forming a pixel electrode layer on one side of the passivation layer away from the substrate.

10. A display panel comprising an array substrate, wherein the array substrate comprises a TFT region and a light-transmitting region comprising:

a substrate;

a gate insulating layer disposed on the substrate;

a passivation layer disposed on one side of the gate insulating layer away from the substrate; and a transparent electrode layer disposed above the substrate; and wherein in the light-transmitting region, at least one of the gate insulating layer and the passivation layer is in surface contact with the transparent electrode layer, and the gate insulating layer and/or the passivation layer in surface contact with the transparent electrode layer are/is a single-layer structure of a silicon nitride layer; and wherein the transparent electrode layer is a common electrode layer, in the light-transmitting region, a refractive index transition layer is further disposed at one side of the common electrode layer close to the substrate, and a refractive index of the refractive index transition layer is between a refractive index of the common electrode layer and a refractive index of the substrate.

11. The display panel according to claim 10, wherein the common electrode layer is disposed on one side of the gate insulating layer close to the substrate, and the gate insulating layer is a single-layer structure of the silicon nitride layer in the light-transmitting region.

12. The display panel according to claim 10, wherein one side of the transparent electrode layer is disposed in surface contact with the gate insulating layer, another side of the transparent electrode layer is disposed in surface contact with the passivation layer, and the passivation layer is a single-layer structure of the silicon nitride layer in the light-transmitting region.

13. The display panel according to claim 12, wherein the gate insulating layer comprises a silicon oxide layer close to the substrate and the silicon nitride layer away from the substrate, wherein the silicon nitride layer of the gate insulating layer is disposed in surface contact with the common electrode layer, and the silicon oxide layer of the gate insulating layer is disposed in surface contact with the substrate.

14. The display panel according to claim 10, wherein the passivation layer comprises a first passivation layer close to the substrate and a second passivation layer away from the substrate, and the transparent electrode layer is disposed between the first passivation layer and the second passivation layer, wherein the first passivation layer is a single-layer structure of the silicon nitride layer in the light-transmitting region.

15. The display panel according to claim 14, wherein one side of the gate insulating layer close to the substrate is in surface contact with the substrate, and the gate insulating layer comprises a silicon oxide layer disposed on the substrate and a silicon nitride layer disposed on one side of the silicon oxide layer away from the substrate.

16. The display panel according to claim 14, wherein one side of the gate insulating layer close to the substrate is in surface contact with the substrate, and the gate insulating layer is a single-layer structure of a silicon oxide layer in the light-transmitting region.

17. The display panel according to claim 10, wherein an absolute value of a difference between a refractive index of the silicon nitride layer and a refractive index of the transparent electrode layer is less than or equal to 0.1.

18. The method according to claim 9, wherein the step b comprises depositing a layer of silicon nitride material and a layer of silicon oxide material above the substrate, removing the silicon oxide material in the light-transmitting region through a photomask to obtain the gate insulating layer, and forming the common electrode layer on the gate insulating layer.

19. An array substrate comprising a TFT region and a light-transmitting region, wherein the light-transmitting region comprises:

a substrate;

a gate insulating layer disposed on the substrate;

a passivation layer disposed on one side of the gate insulating layer away from the substrate; and a transparent electrode layer disposed above the substrate;

wherein in the light-transmitting region, at least one of the gate insulating layer and the passivation layer is in surface contact with the transparent electrode layer, and the at least one of the gate insulating layer and the passivation layer in surface contact with the transparent electrode layer are a single-layer structure of a silicon nitride layer; and wherein the passivation layer comprises a first passivation layer close to the substrate and a second passivation layer away from the substrate, and the transparent electrode layer is disposed between the first passivation layer and the second passivation layer, wherein the first passivation layer is a single-layer structure of the silicon nitride layer in the light-transmitting region.

20. The array substrate according to claim 19, wherein the transparent electrode layer is a common electrode layer disposed on one side of the gate insulating layer close to the substrate, and the gate insulating layer is a single-layer structure of the silicon nitride layer in the light-transmitting region.

* * * * *